United States Patent [19]

Akbar et al.

[11] Patent Number: 5,259,918
[45] Date of Patent: Nov. 9, 1993

[54] HETEROEPITAXIAL GROWTH OF GERMANIUM ON SILICON BY UHV/CVD

[75] Inventors: Shahzad Akbar, Poughkeepsie; Jack O. Chu, Astoria; Brian Cunningham, Highland, all of N.Y.

[73] Assignee: International Business Machines Corporation, Armonk, N.Y.

[21] Appl. No.: 714,297

[22] Filed: Jun. 12, 1991

[51] Int. Cl.$^5$ .............................. C30B 25/12
[52] U.S. Cl. ...................... 156/610; 456/613; 456/614; 456/DIG. 67; 437/126; 437/131
[58] Field of Search ....... 156/610, 613, 614, DIG. 67; 437/126, 131; 148/DIG. 59

[56] References Cited

U.S. PATENT DOCUMENTS

| | | | |
|---|---|---|---|
| 3,473,978 | 10/1969 | Jackson, Jr. | 148/175 |
| 3,615,855 | 9/1971 | Smith | 437/126 |
| 4,529,455 | 7/1985 | Bean | 148/175 |
| 4,806,996 | 2/1989 | Luryi | 156/DIG. 67 |
| 4,843,028 | 6/1989 | Herzog et al. | 437/126 |
| 4,861,393 | 8/1989 | Bean | 48/33.4 |
| 4,891,329 | 1/1990 | Reisman et al. | 148/DIG. 59 |
| 4,997,776 | 3/1991 | Harame et al. | 437/33 |

FOREIGN PATENT DOCUMENTS

| | | |
|---|---|---|
| 0-140813 | 7/1985 | Japan . |
| 2-179113 | 8/1987 | Japan . |
| 3-140521 | 6/1988 | Japan . |
| 4-5011 | 1/1989 | Japan . |

OTHER PUBLICATIONS

"The heteroepitaxy of Ge on Si: A comparison of chemical vapor and vacuum deposited layers", by M. Maenpaa, et al., J. Appl. Phys., Feb. 1982, pp. 1076–1083.
"Low-temperature silicon epitaxy by ultrahigh vacuum/chemical vapor deposition", by B. S. Meyerson, Appl. Phys. Lett., Mar. 24, 1986, pp. 797–799.
"Low Temperature Silicon Epitaxy by Hot Wall Ultrahigh Vacuum/Low Pressure Chemical Vapor Deposition Techniques: Surface Optimization", by B. S. Meyerson, et al., Journal of the Electrochemical Society, vol. 133, No. 6, Jun. 1986, pp. 1232–1235.
"Cooperative growth phenomena in silicon/germanium low-temperature epitaxy", by B. S. Meyerson, et al., Appl. Phys. Lett. 53, Dec. 19, 1988, pp. 2555–2557.
"Influence of surfactants in Ge and Si epitaxy on Si(001)", by M. Copel, et al., Physical Review B. vol. 42, No. 18, Dec. 15, 1990-II, pp. 11682–11690.
Ishii et al, "Selective Ge Deposition on Si Using Thermal Decomposition of GeH$_4$", Applied Physics Letters 47(8) Oct. 1985 pp. 863–865.

Primary Examiner—Robert Kunemund
Attorney, Agent, or Firm—Michael J. Balconi-Lamica; Graham S. Jones, II; Richard A. Romanchik

[57] ABSTRACT

A method of depositing Ge on a Si substrate in a reaction chamber includes the steps of: precleaning the substrate; evacuating the chamber to a pressure below $10^{-9}$ Torr; heating the substrate to 300–375 degrees C; and providing a 10% GeH$_4$, 90% He mixture of gas with a GeH$_4$ partial pressure of 1–5 mTorr.

34 Claims, 7 Drawing Sheets

HETEROEPITAXIAL GROWTH OF GERMANIUM ON SILICON BY UHV/CVD

TECHNICAL FIELD

This invention relates to semiconductor manufacturing processes, and more particularly, a method of growing heteroepitaxial layers of germanium (Ge) on silicon (Si) by low temperature UHV/CVD epitaxy.

BACKGROUND ART

The deposition of heteroepitaxial Ge and $Ge_xSi_{1-x}$ alloys on Si has attracted widespread interest because of the possibility of tailoring the band gap of $Ge_xSi_{1-x}$ based heterostructures. Proposed uses for these heterostructures include optical devices, modulation doped transistors, and heterojunction bipolar transistors. For example, thin films of elemental Ge grown on Si substrates may be utilized as an intermediate epilayer to allow subsequent growth of gallium arsenide (GaAs) for optoelectronic integration on Si or for use as a SiGe heterojunction in high performance electronic device applications. Since GaAs is better lattice matched to Ge and can be easily deposited on it, a high quality epitaxial Ge layer on Si serves as a suitable substrate for the subsequent growth of GaAs and possibly other layers (e.g. $Ga_xAl_{1-x}As$), and consequently allows for the integration of GaAs optoelectronic devices with Si based devices.

Heteroepitaxial growth of pure Ge is most desirable, in particular, because the higher the Ge content of the structure, the higher the carrier mobility which, in turn, provides higher current capability, lower power consumption, lower temperature operation and greater speed. Also, as previously mentioned, pure Ge provides optoelectronic capability.

A complicating factor in fabricating Ge-Si heterojunction systems, however, is a large mismatch in both lattice parameter ($\simeq 4\%$), and thermal expansion coefficient ($\simeq 50\%$). Previous attempts to produce Ge-Si heterostructures exhibit a marked variation in the growth morphology and crystalline quality attributable to contamination presence at the Ge-Si interface, which is determined primarily by the initial condition and preparation of the Si substrate surface and improper deposition process parameters.

Ge and $Ge_xSi_{1-x}$ alloys have previously been deposited on Si by a variety of techniques, including ion-sputtering, physical vapor deposition, chemical vapor deposition (CVD), and more recently, molecular beam epitaxy (MBE). CVD is the most advantageous of these processes because it is a high throughput process and also because it has in-situ doping capabilities. However, the high temperatures, high pressures and carrier gases characteristic of conventional CVD systems produce undesirable surface roughness and therefore render the process impractical for many applications.

Examples of prior methods of heteroepitaxial growth of Ge on Si utilizing CVD are disclosed in the following publications.

Maenpaa, et al., "The heteroepitaxy of Ge on Si: A comparison of chemical vapor and vacuum deposited layers", J. Appl. Phys. 53(2), (February 1982), 1076-1083, (Maenpaa et al.) describes a CVD experiment performed utilizing $GeH_4$ as a carrier gas with a pressure of 2-13 Torr and maintaining the Si temperature between 500°-900° C.

Hitoshi Ishii, "Manufacture of Semiconductor Device and Equipment Therefor", Japanese Patent publication 62-179113, application no. 61-20283, (Ishii) discloses the deposition of Ge using $GeH_4$ as a carrier gas in a CVD chamber at 450° C.

U.S. Pat. No. 3,473,978 (Jackson), entitled "Epitaxial Growth of Germanium", teaches a method for the nucleation and growth of monocrystalline germanium on a Si substrate which comprises epitaxially growing a layer of monocrystalline Si at a temperature of at least 900° C., then cooling the Si below 670° C., followed by the nucleation and growth of Ge.

More recently, ultrahigh vacuum chemical vapor deposition (UHV/CVD) processes have been utilized for growing of $Ge_xSi_{1-x}$ layers onto Si. Examples of this technique are disclosed in the following references.

Meyerson, Uram and LeGoues, "Cooperative growth phenomena in silicon/germanium low-temperature epitaxy", (Appl. Phys. Lett. 53 (25), Dec. 19, 1988, 1988 American Institute of Physics), (MEYERSON ET AL.), which teaches deposition of alloys of composition $0 \leq Ge/Si \leq 0.20$ using UHV/CVD and a temperature of 550° C.

Racanelli and Greve, "Growth of Epitaxial Layers of $Ge_xSi_{1-x}$ by UHV/CVD", (Mat. Res. Soc. Symp. Proc. Vol. 198, 1990 Materials Research Society), (RACANELLI et al.), which teaches a method of growing epitaxial layers of a $Ge_xSi_{1-x}$ composition on Si at temperatures between 577 and 665° C.

Figure 1:
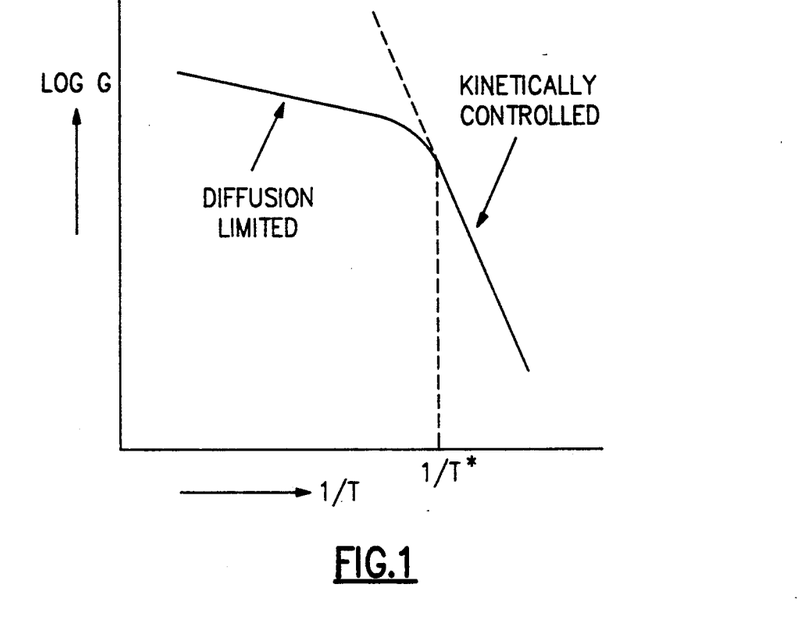
FIG. 1 is a graph of a typical growth rate curve for a CVD process.

In CVD and UHV/CVD processes of the prior art, a reactant gas is transported over a heated substrate. A chemical decomposition reaction occurs on the substrate and deposition occurs with a growth rate which is variably dependent upon the substrate temperature, wherein two distinct temperature (high and low) regimes are found to exist. In the low temperature regime, deposition is strongly dependent upon temperature, while only a small dependence is shown for the high temperature regime. FIG. 1 illustrates a typical CVD growth rate versus temperature curve. For the low temperature regime, wherein deposition is kinetically controlled via a surface decomposition, the overall growth rate G follows an Arrhenius plot according to:

$$G = G_o exp(-\Delta E/kT_s)$$

where:
$G_o$ is a pre-exponential factor,
$\Delta E$ is the apparent activation energy
k is Boltzmann constant
$T_s$ is the substrate temperature.

The value of the activation energy can be used to postulate the rate limiting step of the surface reaction or, conversely, if the rate limiting step is known, to determine the activation energy for such a reaction.

It is to be noted that above the transition temperature, T*, the growth rate is mass transport/diffusion-limited. In this regime the rate limiting step is the diffusion of the gaseous reactant to the surface, since the high deposition temperature rapidly decomposes and incorporates the molecules arriving on the surface. This fast decomposition step makes available a sufficient number of surface sites to allow for the continuous adsorption of the arriving reactant species. Since the diffusion coefficient varies slowly with temperature, a slower increase in growth rate is observed in the diffusion limited regime as compared to the kinetically controlled regime.

This behavior has been observed for CVD of epitaxial Si from a variety of gas sources (e.g. $SiH_xCl_{1-x}$).

Figure 2A:
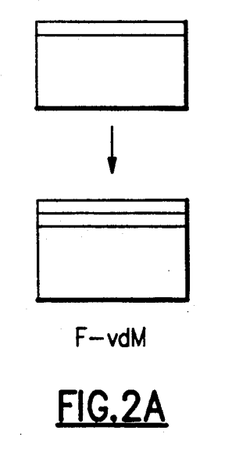
FIG. 2A is a simplified schematic representation of a F-vdM heteroepitaxial growth mode.
Figure 2B:
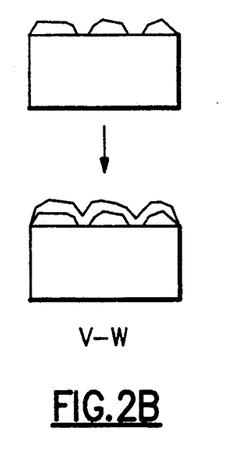
FIG. 2B is a simplified schematic representation of a V-W heteroepitaxial growth mode.
Figure 2C:
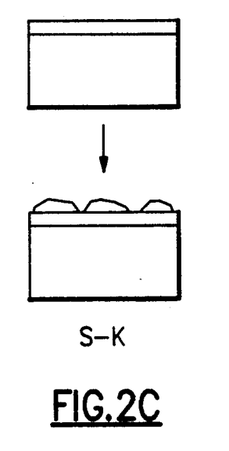
FIG. 2C is a simplified schematic representation of a S-K heteroepitaxial growth mode.

As previously mentioned, it is the heteroepitaxial growth of Ge which is desirable. FIGS. 2 A-C show schematic representations of the three basic modes of heteroepitaxial growth. The first mode (FIG. 2A) is known as Frank-van der Merwe (F-vdM) wherein growth proceeds in a layer by layer mode (2D). The second mode (FIG. 2B) is known as Volmer-Weber (V-W), wherein island growth (3D) occurs. The third mode (FIG. 2C) is known as Stranski-Krastanov (S-K), which proceeds initially as layer by layer growth, followed by islanding after a critical thickness has been exceeded. In the absence of any strain in the epilayer (i.e. for lattice matched systems), the growth mode is determined by the surface energy of the substrate ($\sigma_1$) and epilayer ($\sigma_2$), and the interface energy ($\gamma_{12}$) and is predicted purely by the following thermodynamic free energy considerations:

$$\sigma_1 > \sigma_2 + \gamma_{12} \quad F\text{-}vdM \qquad (2D)$$

$$\sigma_1 < \sigma_2 + \gamma_{12} \quad V\text{-}W \qquad (3D)$$

When the epilayer has a large mismatch to the substrate, as is the case for Ge on Si, an additional term must be included to account for the strain energy of the epilayer. This strain energy ($\epsilon_t$) increases as the epilayer thickness increases, and the expressions used to determine the growth mode then become:

$$\sigma_1 > \sigma_2 + \gamma_{12} + \epsilon_t \quad F\text{-}vdM \qquad (2D)$$

$$\sigma_1 < \sigma_2 + \gamma_{12} + \epsilon_t \quad V\text{-}W \qquad (3D)$$

Since $\epsilon_t$ is positive, systems which are expected to grow in a V-W mode in the absence of strain will not be affected by the additional strain energy term. It is, however, possible for the system to begin growth in the F-vdM mode and change to 3D growth if the strain energy exceeds a critical value. This mode of growth is the S-K mode, and is shown schematically in FIG. 2C.

It should be noted that the preceding theoretical model of the growth modes is only valid in a strict sense, that is, if no chemical reactions or other changes on the surface occur during film growth. In other words, the predicted growth mechanisms are based purely on energy considerations.

Figure 3:
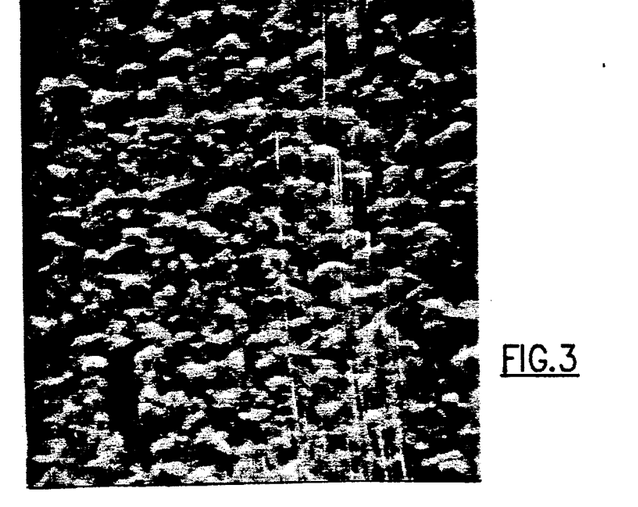
FIG. 3 is a Scanning Electron Micrograph of rough surface morphology resulting from prior art methods of depositing of Ge on Si.

The surface free energy of Ge is smaller than that of Si by about 10%, which would imply that the growth of Ge/Si should proceed in a F-vdM mode, However, since the misfit between the two lattices is approximately 4%, the accumulation of strain energy, in fact, produces S-K growth, with 3-4 monolayers (ML) of layer by layer growth occurring prior to island formation. Prior techniques, (such as those mentioned hereinbefore), for depositing Ge on Si have been undesirable because these factors have produced rough surface morphology, as illustrated in FIG. 3.

In addition to the production of films having rough surface morphology, CVD methods of the prior art are undesirable because they require high processing temperatures, thereby limiting device application. Also, prior CVD methods utilize poor vacuum processing techniques, which cause system contamination, thereby affecting surface interface quality essential to film growth.

Likewise, none of the aforementioned UHV/CVD references describe a suitable method for growing pure Ge on Si.

It is possible, however, to amend the aforementioned Ge growth mechanisms by changing the equilibrium conditions of the surface during growth. A system which accomplishes this and overcomes the deficiencies of the prior art is highly desirable.

DISCLOSURE OF THE INVENTION

An object of the present invention is to provide a method of heteroepitaxially growing pure Ge on Si.

Another object of the present invention is to provide a method of heteroepitaxially growing Ge on Si wherein the deposited Ge has a smooth, continuous surface morphology.

Another object of the present invention is to provide a method of heteroepitaxially growing Ge on Si utilizing low pressures and low temperatures.

According to the present invention, a UHV/CVD process is utilized to induce 2D layer by layer heteroepitaxial growth of Ge on Si using temperatures less than 500° C. and pressures between 10 and 50mTorr with a 12.5-25sccm gas source of 10% $GeH_4$/He.

The present invention facilitates the growth of thin, epitaxial Ge films having abrupt junctions. The surface morphology of these epitaxial films is sufficiently smooth to allow subsequent epitaxial growth of differently built Ge or other thin films for device application. Also, the Ge films show complete selectivity for growth on Si versus $SiO_2$. The Ge films can be in-situ doped with boron to yield P-type Ge films with good electrical properties. In addition, the Ge films can be in-situ doped with phosphorous or arsenic to yield N-type Ge films. Also, safer chemistry is employed using 10% $GeH_4$/He rather than previously utilized 100% $GeH_4$.

These and other objects, features and advantages of the present invention will become more apparent in light of the detailed description of exemplary embodiments thereof as illustrated by the drawing.

BEST MODE FOR CARRYING OUT THE INVENTION

Figure 4:
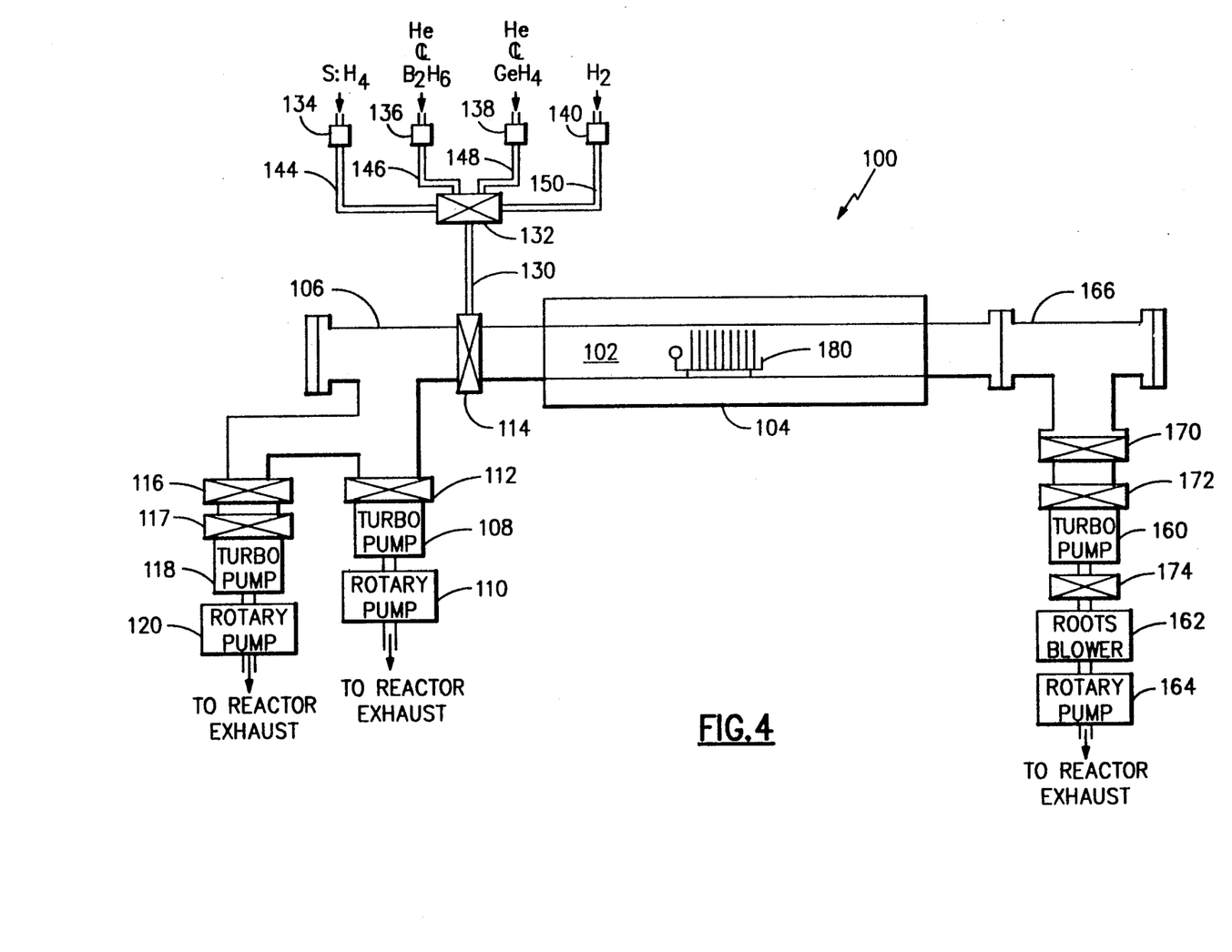
FIG. 4 is a simplified schematic block diagram of the UHV/CVD system utilized for the method of the present invention.

Referring now to FIG. 4, the UHV/CVD system 100 utilized for carrying out the process of the present invention includes a quartz reaction chamber 102, a furnace 104, which surrounds the quartz reaction chamber 102, and a load lock chamber 106. Chamber 102, furnace 104 and load lock chamber may be any of a number of suitable UHV/CVD systems known in the art. A typical base pressure for the chambers of UHV/CVD system 100 is below $10^{-9}$ Torr. That is, when activated, the reaction chamber 102 and the load lock chamber 106 are evacuated to initial equilibrium pressures of below $10^{-9}$ Torr. Furnace 104 provides heating of reaction chamber 102 to thereby heat the reaction chamber 102 to a prescribed process temperature. A valve 114, such as part number 10746-CE44 manufactured by VAT, isolates the load lock chamber 106 from the reaction chamber 102. A valve 112 similar to valve 114 isolates the load lock chamber 106 from a pair of evacuation pumps 108, 110, such as part numbers TMP 1500 and D65-BCS, respectively, manufactured by Liebold, which are in series with the load lock chamber and are utilized to evacuate the chamber 106. A bypass valve 116, similar to valve 114, and a metering valve 117, such as Model Number SS-4BMRW made by Nupro, isolate the load lock chamber 106 from a pair of evacuation pumps 118, 120, such as Liebold part numbers TMP 450 and D65-BCS, respectively, which are also in series with the load lock chamber 106 and utilized to pre-evacuate the chamber 106. Gas is provided to valve 114 from a valve 132 through a gas line 130. Valve 132 controls the mixture of gas coming from four different sources (not shown). Silane ($SiH_4$) is provided through a flow controller 134 and a gas line 144. A 99.99% He and 0.01% $B_2H_6$ mixture is provided through a flow controller 136 and a gas line 146. A 10% $GeH_4$ and 90% He mixture is provided through a flow controller 138 and a gas line 148. $H_2$ is provided through a flow controller 140 and gas line 150. The flow controllers may be any of a number known in the art such as part number 1449A manufactured by MKS. A series of three pumps, 160, 162, 164, exhaust gas from the reaction chamber 102 via an evacuation chamber 166. The pumps 160, 162 and 164 utilized for this application may be Liebold part numbers TMP 1500, WS 250, and D65-BCS, respectively. A throttle valve 170, such as part number 228-0400 manufactured by HVA and a valve 172, similar to valve 114, are connected in series between pump 160 and the evacuation chamber 166. A valve 174, such as Model Number 151-0050K made by HPS, is connected between the pump 162 and pump 160.

Subsequent to activating the UHV/CVD system 100, operation of the UHV/CVD system 100 in accordance with the process of the present invention is as follows:

First, wafers having exposed Si surfaces (or substrates) are precleaned using a special cleaning process (hereinafter known as a Huang clean) which is comprised of a) immersing the wafers in a 5:1:1 solution of $H_2O:H_2O_2:NH_4OH$ at 65° C. for 1 minute followed by a deionized $H_2O$ rinse, and b) immersing the wafers in a 5:1:1 solution of $H_2O:H_2O_2:HCl$ at 65° C. for 1 minute, followed by another deionized water rinse.

Next, the wafers are etched in a dilute 10:1 HF solution at room temperature for 10 to 15 seconds and then placed on a wafer boat 180 and placed in load lock chamber 106. Placing of the wafer boat 180 into the load lock chamber 106 results int he pressure inside the load lock chamber 106 rising to room pressure, i.e., atmospheric pressure. The load lock chamber 106 is then slowly pre-evacuated through pumps 118, 120 by opening valve 116 and adjusting metering valve 117 to thereby create a first prescribed pressure of approximately 10 to 50 mTorr in the load lock chamber 106.

Valve 116 is then closed and the load lock chamber 106 is quickly evacuated through valve 112 and pumps 108, 110 to a second prescribed pressure of approximately $10^{-7}$ Torr.

Next, flow controller 140 bleeds $H_2$ through valves 132 and 114 and into the reaction chamber 102 at a rate of approximately 650 sccm, whereby the reaction chamber pressure rises to a transfer pressure Next, valve 114 is opened, thereby exposing load lock chamber 106 to the reaction chamber 102 and the wafers are transferred from the load lock chamber 106 to the reaction chamber 102. It is to be noted that the aforementioned flow of hydrogen reduces cross contamination of the two chambers during this wafer transfer process.

It is to be noted that the reaction chamber 102 is maintained at a transfer pressure of about 200–300 mTorr by pumps 160, 162, 164 and valves 170, 172, 174 during the aforementioned wafer transfer steps.

Next, valve 114 is shut, thereby sealing the load lock chamber 106 from the reaction chamber 102.

Next, flow controller 114 stops the flow of $H_2$ and flow controller 138 starts a flow of the He and $GeH_4$ mixture at a rate of approximately 10 to 25 sccm through the reaction chamber 102. Throttle valve 170 is then adjusted to produce a $GeH_4$ partial pressure of approximately 1–5 mTorr. If the temperature of the reaction chamber 102 is maintained at prescribed process temperature of approximately 300°–375° C., F-vdM growth (described hereinbefore) of Ge on the Si wafers occurs. The preferred process conditions for a single run at 350° C. would be a $GeH_4$/He flow rate of 12.5 sccm, with a total process pressure of 10–20 mTorr and a subsequent $GeH_4$ partial pressure of 1–2 mTorr. Since the Ge partial pressure during this deposition is extremely low, homogeneous pyrolysis of $GeH_4$ is negligible. The appropriate mechanistic mode of growth is then heterogeneous surface decomposition of $GeH_4$.

The aforementioned process provides heteroepitaxial growth of Ge on a Si substrate. It is to be noted that Ge may be deposited on substrates comprised of materials other than Si utilizing the method of the present invention. For instance, Ge may be deposited on a $Ge_xSi_{1-x}$ substrate in accordance with the present invention. Also, materials other than Ge may be deposited if different gases are utilized in the reaction chamber. For instance, Si may be deposited if $SiH_4$ is used instead of $GeH_4$. If homoepitaxial growth of Si films is desired, $SiH_4$ should be provided at a constant flow of 4–5 sccm and a Si partial pressure of 1-2 mTorr at temperatures at approximately 550° C.

Figure 5A:
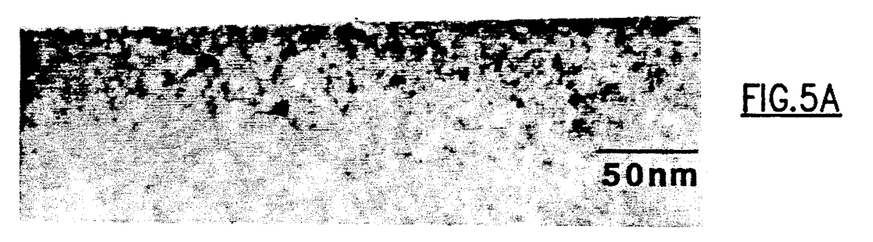
FIGS. 5A-5H are cross sectional Transmission Electron Micrographs of structures of Ge grown on Si at different temperatures according to the method of the present invention.
Figure 5B:
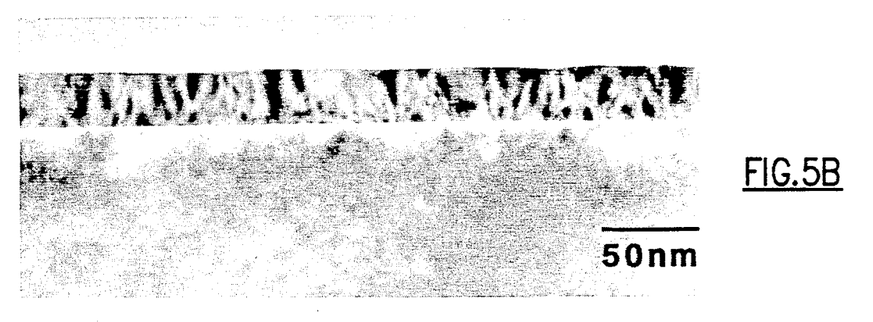
Figure 5C:
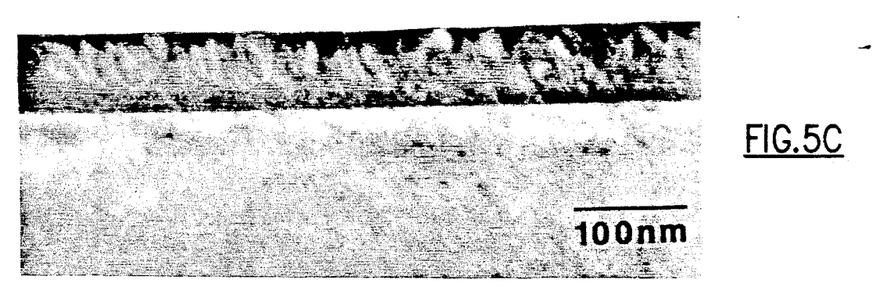
Figure 5D:
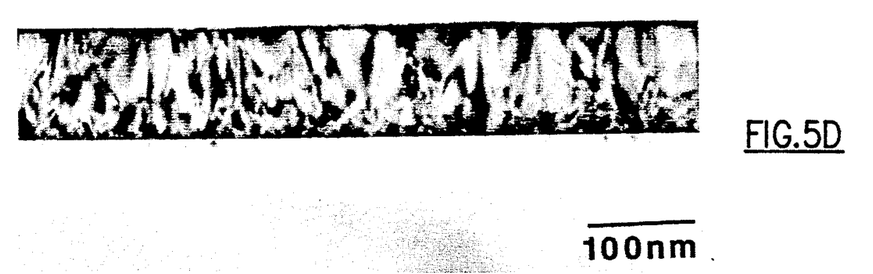
Figure 5E:
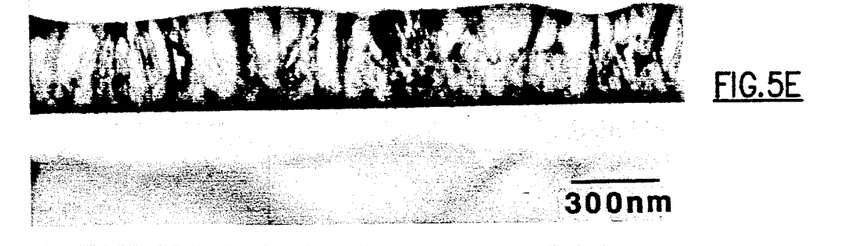
Figure 5F:
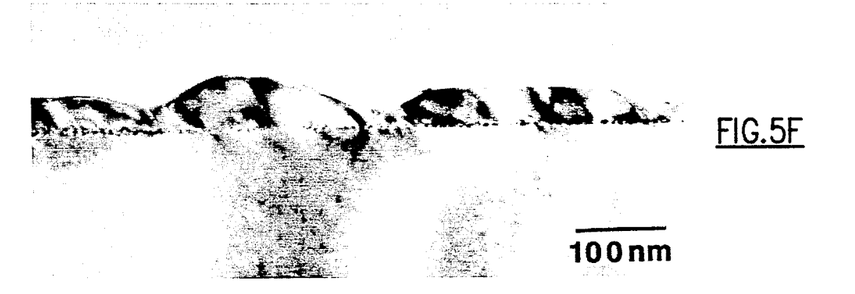
Figure 5G:
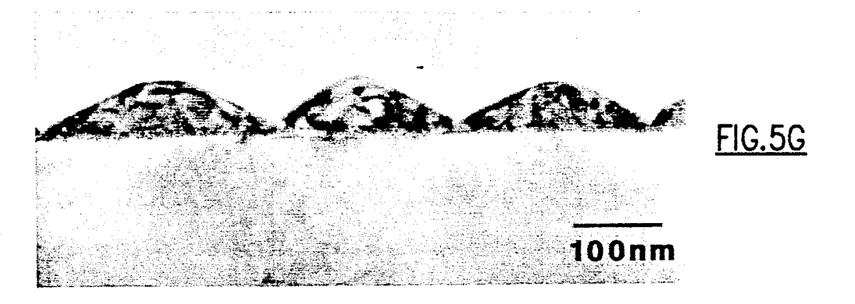
Figure 5H:
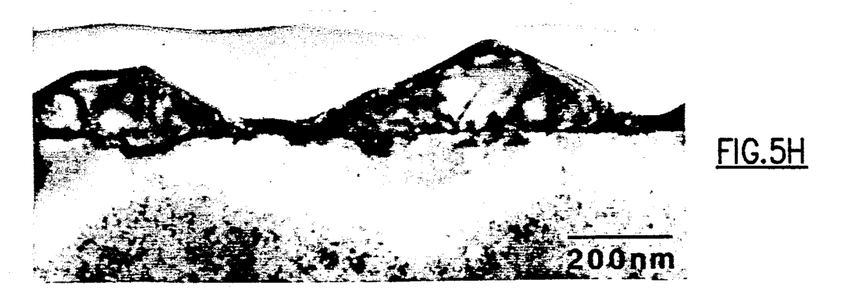

Referring now to FIGS. 5A-5H, cross-sectional micrographs of films grown by the deposition method of the present invention at eight different temperatures, in the range of 275° C. to 560° C. are shown. Films grown at or below 275° C. show almost no growth occurs for up to eleven hours, as illustrated in FIG. 5A. FIGS. 5B-5D illustrate that between 300° C. and 350° C. the films are smooth indicating the growth has proceeded by 2D process. Referring now to FIG. 5E, at 375° C. the 2D growth appears to be giving way to 3D growth as evidenced by the slight roughness of the film. Above 375° C. growth occurs as 3D islanding as illustrated by FIGS. 5F-5H. This islanding is extremely apparent at 560° C. (FIG. 5H).

Figure 6:
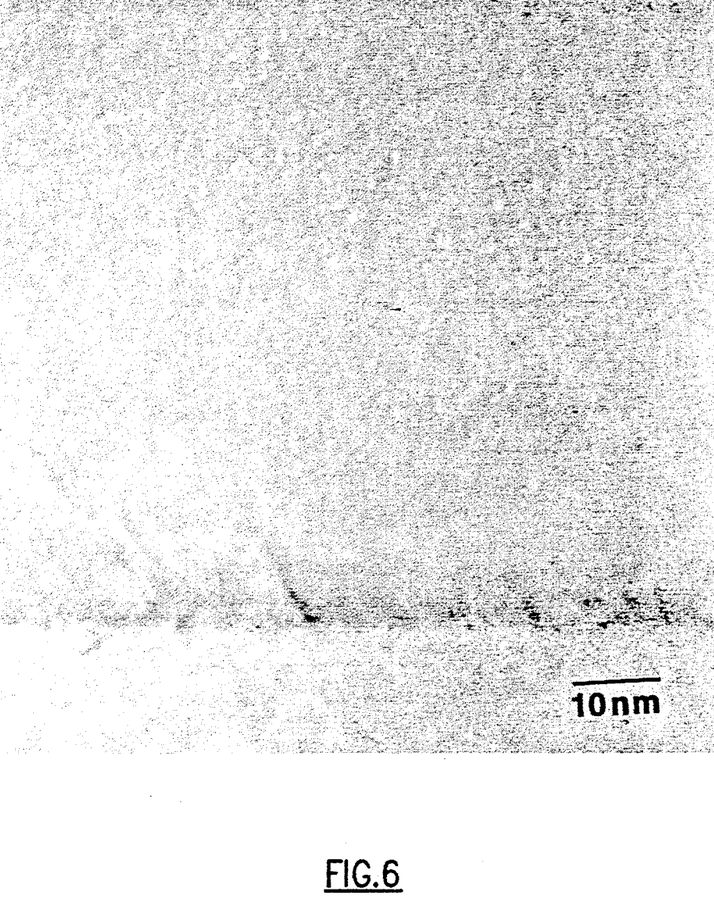
FIG. 6 is a high resolution Transmission Electron Micrograph of a structure of Ge grown on Si at 350° C. according to the method of the present invention.

Referring now to FIG. 6, a high resolution transmission electron micrograph of a Ge film grown at 350° C. exhibits excellent surface smoothness on an atomic scale.

Figure 7A:
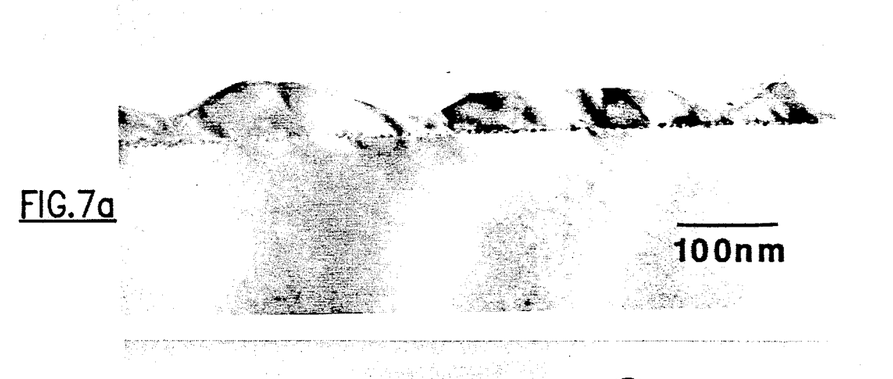
FIGS. 7A-7B are cross sectional Transmission Electron Micrographs of structures of Ge grown on Si at 400° C. for 1 hr and 9 hrs, respectively, according to the method of the present invention.
Figure 7B:
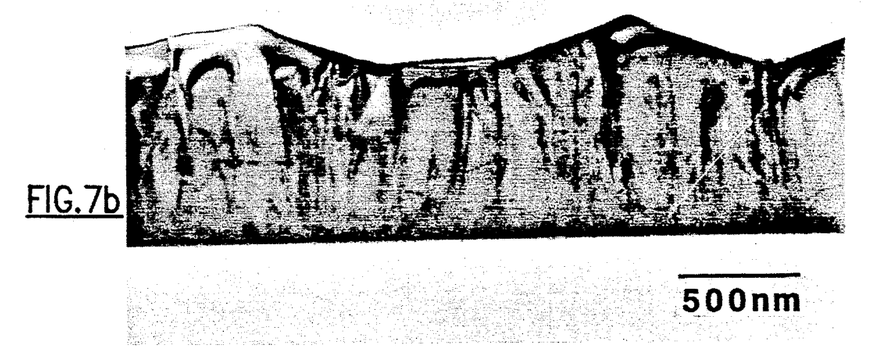

Referring now to FIGS. 7A and 7B, two Ge films both grown at 400° C., but for two substantially different times are illustrated. The film in FIG. 7A was grown for about 1 hour and the film grown in FIG. 7B was grown for about 9 hours. As the growth time is extended, the magnitude of the surface roughness increases, indicating that there is no smoothing out of the roughness with increasing deposition time.

The growth rates at the different temperatures were determined by measuring the thickness of films grown for long times (>4 hrs), to minimize possible effects due to any nucleation periods associated with the adsorption of $GeH_4$ on a Si surface. The growth rates for the rough films were determined by measuring an average film thickness.

Figure 8:
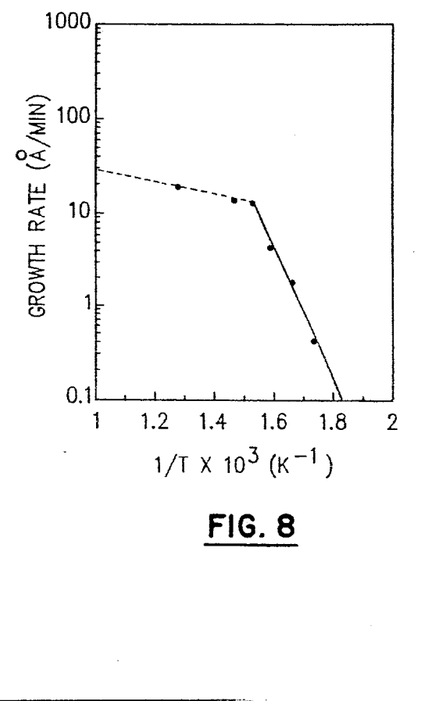
FIG. 8 is an Arrhenius plot of UHV/CVD growth of Ge on Si according to the method of the present invention.

Referring now to FIG. 8, the results of the growth rate of Ge grown on Si in accordance with the present invention are plotted against 1/T. FIG. 8, shows that the growth rate has an Arrhenius temperature dependence, with an activation energy of 1.46eV (33kcal/mole) for the temperature regime between 300° C. and 375° C. It is to be noted that two distinctive slopes are present in FIG. 8, a first more gradual slope and then a steeper slope. Deposition of Ge in accordance with the method of the present invention occurs in the regime of the steeper slope.

Figure 9:
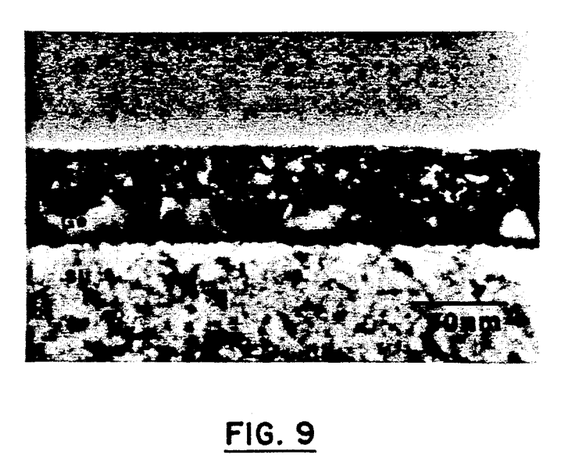
FIG. 9 is a cross sectional Transmission Electron Micrograph of a Si/Ge/Si structure grown in accordance with the method of the present invention.

Referring now to FIG. 9, a two step deposition of Ge on (100) Si according to the method of the present invention at 350° C., followed by a deposition of Si on the thin Ge film was performed. The Si was deposited at 550° C., by the decomposition of $SiH_4$. FIG. 9 shows a Transmission Electron Micrograph of the resultant Si/Ge/Si structure. Although the UHV/CVD Si film is heavily faulted, it can be seen that the film has grown in a layer by layer (F-vdM) mode. Prior art models for this deposition, on the contrary, predict a V-W growth mode. It is to be noted that the growth of these types of Si/Ge/Si structures may very well be of more technological interest than Ge/Si structures because, for example, of the possible applications in high electron mobility transistors (HEMT).

Figure 10:
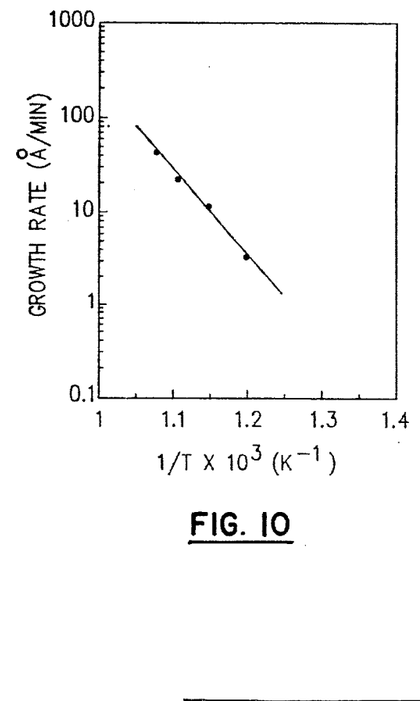
FIG. 10 is an Arrhenius plot of UHV/CVD growth of Si on Ge according to the method of the present invention.

Referring now to FIG. 10, the growth rates of homo-epitaxial Si films grown in accordance with the present invention in the temperature range 550° C.-650° C. are plotted against 1/T.

An explanation for the results of deposition of Ge according to the present invention will now follow. In the low temperature regime (300° C. to 375° C.), where growth rate is surface reaction limited, the heteroepitaxial growth mode of the Ge according to the method of the present invention is layer by layer. This 2D growth observed in the low temperature regime is believed to be due to the control of the growth kinetics by a surface reaction mechanism (i.e. the $H_2$ desorption step prior to lattice incorporation of the Ge). The $GeH_x$ surface species are likely to be less mobile (and less reactive) than Ge atoms, due to hydrogen termination at the growth interface, thereby reducing the overall surface mobility and preventing island formation. Above a transition temperature of about 375° C., the growth rate is controlled by diffusion and adsorption of $GeH_4$ from the gas phase and the growth mode changes to S-K. The growth kinetics are dominated by the flux of $GeH_4$ molecules adsorbed on the surface. In this regime the UHV/CVD behavior is similar to MBE where the growth rate is controlled by the flux of Ge atoms impinging on the surface.

$Ge_xSi_{1-x}$ films grown on (100) Si are also observed to exhibit the aforementioned growth-rate vs. temperature characteristics. As the Ge concentration in the $Ge_xSi_{1-x}$ films is increased, there is a stronger tendency for island formation, again as a consequence of the strain energy term driving the growth from 2D to 3D. Since the lattice mismatch increases as the Ge fraction increases, the strain energy term also increases.

It is to be noted that a large density of threading dislocations was observed in all of the films grown according to the method of the present invention. Although the object of the present invention is not to minimize defect densities, nor to correlate the defect structure with growth parameters, initial experiments with rapid thermal annealing indicate that it is possible to substantially reduce the density of these dislocations. Misfit dislocations were observed at the Ge/Si interface, as expected from energetic considerations due to the large lattice mismatch. From a device application point of view, the control or elimination of these defects is desirable.

Furthermore, it is to be noted that Ge may also be grown on $Ge_xSi_{1-x}$ substrates according to the method of the present invention disclosed hereinbefore.

It is also to be noted that the Si and/or Ge films may be in-situ doped (e.g. boron doping) in a manner well known in the UHV/CVD processing art. Process conditions in the reaction chamber 102 for boron doping may be, for instance, a 1-30 sccm flow of a 100 ppm mixture of $B_2H_6$ in He.

It is further to be noted that Ge deposition in accordance with the present invention was carried out on (100) Si surfaces. Other crystal orientation Si surfaces may be utilized, however, as the deposition substrate.

Although the invention has been shown and described with exemplary embodiments thereof, it should be understood by those skilled in the art that the foregoing and various other changes, omission, and additions may be made therein and thereto without departing from the spirit and the scope of the invention.

We claim:

1. A method of depositing Ge onto a substrate in a reaction chamber, said method comprising the steps of:
   a) evacuating the reaction chamber and an associated load lock chamber to initial equilibrium pressures of below $10^{-9}$ Torr;
   b) heating the reaction chamber to a prescribed process temperature;
   c) precleaning the substrate;

d) placing the substrate into the load lock chamber, whereby the load lock chamber pressure rises to atmospheric pressure, the load lock chamber being isolated from the reaction chamber during the placing of the substrate into the load lock chamber;

e) evacuating the load lock chamber slowly from atmospheric pressure to a first prescribed pressure and then further evacuating the load lock chamber quickly from the first scribed pressure to a second prescribed pressure;

f) bleeding $H_2$ into the reaction chamber, whereby the reaction chamber pressure rises to a transfer pressure;

g) opening the load lock chamber to the reaction chamber and transferring the substrate from the load lock chamber to the reaction chamber, whereby the bleeding of $H_2$ of the previous step reduces cross contamination between the load lock chamber and the reaction chamber during the transfer, and wherein the substrate heats up to the prescribed process temperature inside the reaction chamber; and, h) stopping the bleeding of $H_2$ and providing a mixture of $GeH_4$ and He gas int he reaction chamber to thereby deposit Ge onto the substrate, and wherein the reaction chamber equilibrates to a process pressure.

2. A method of depositing Ge onto a substrate in a chamber according to claim 1, wherein the substrate is comprised of Si.

3. A method of depositing Ge onto a substrate in a chamber according to claim 1, wherein the substrate is comprised of $Ge_xSi_{1-x}$.

4. A method of depositing Ge onto a substrate in a chamber according to claim 1, wherein said mixture is on the order of 10% $GeH_4$ and 90% He.

5. A method of depositing Ge onto a substrate in a chamber according to claim 1, wherein the partial pressure of $GeH_4$ is on the order of 1 to 5 mTorr.

6. A method of depositing Ge onto a substrate in a reaction chamber according to claim 1, wherein step c) comprises:

immersing the substrate in about a 5:1:1 solution of $H_2O:H_2O_2:NH_4OH$ at about 65° C. for about 1 minute;

rinsing the substrate with deionized $H_2O$;

immersing the substrate in about a 5:1:1 solution of $H_2O:H_2O_2:HC_1$ at about 65° C. for about 1 minute; and, rinsing the substrate with deionized $H_2O$.

7. A method of depositing Ge onto a substrate in a reaction chamber according to claim 1, wherein step h) comprises providing said mixture at a flow rate on the order of 12.5 to 25 sccm.

8. A method of depositing Ge onto a substrate in a chamber according to claim 1, wherein step b) comprises heating to a temperature on the order of 300° to 375° C.

9. A method of depositing Ge onto a substrate in a reaction chamber according to claim 1, wherein step c) comprises immersing the substrate in about a 10:1 solution of $H_2O:HF$ at room temperature for about 10 to 15 seconds.

10. A method of depositing Ge onto a substrate in a reaction chamber according to claim 1, further comprising the step of depositing Si onto the Ge after step h).

11. A method of depositing Ge onto a substrate in a reaction chamber according to claim 10, further comprising the steps of repeating steps a) through h) after depositing Si.

12. A method of depositing Ge onto a substrate in a reaction chamber, said method comprising the steps of:

a) evacuating the reaction chamber and an associated load lock chamber to initial equilibrium pressures of below $10^{-9}$ Torr;

b) heating the reaction chamber to a prescribed process temperature;

c) immersing the substrate in about a 5:1:1 solution of $H_2O;H_2O_2:NH_4OH$ at about 65° C. for about 1 minute;

d) rinsing the substrate with deionized $H_2O$;

e) immersing the substrate in about a 5:1:1 solution of $H_2O;H_2O_2:HCl$ at about 65° C. for about 1 minute;

f) rinsing the substrate with dionized $H_2O$;

g) immersing the substrate in about a 10:1 solution of $H_2O:HF$ at room temperature for about 10 to 15 seconds;

h) placing the substrate into the load lock chamber, whereby the load lock chamber pressure rises to atmospheric pressure, the load lock chamber being isolated form the reaction chamber during the placing of the substrate into the load lock chamber;

i) evacuating the load lock chamber slowly from atmospheric pressure to a first prescribed pressure and then further evacuating the load lock chamber quickly from the first prescribed pressure to a second prescribed pressure;

j) bleeding $H_2$ into the reaction chamber, whereby the reaction chamber pressure rises to a transfer pressure;

k) opening the load lock chamber to the reaction chamber and transferring the substrate from the load lock chamber to the reaction chamber, whereby the bleeding of $H_2$ of the previous step reduces cross contamination between the load lock chamber and the reaction chamber during the transfer, and wherein the substrate heats up to the prescribed process temperature inside the reaction chamber; and, l) stopping the bleeding of $H_2$ and providing a mixture of $GeH_4$ and He gas int he reaction chamber to thereby deposit Ge onto the substrate, and wherein the reaction chamber equilibrates to a process pressure.

13. A method of depositing Ge onto a substrate in a reaction chamber according to claim 12, wherein the substrate is comprised of Si.

14. A method of depositing Ge onto a substrate in a reaction chamber according to claim 12, wherein the substrate is comprised of $Ge_xSi_{1-x}$.

15. A method of depositing Ge onto a substrate in a reaction chamber according to claim 12, further comprising the strep of depositing Si onto the Ge after the last step.

16. The method of claim 12, wherein:

the prescribed process temperature of step b) comprises a temperature on the order of 300° to 375° C.;

the fist prescribed pressure of step i) comprises a pressure of approximately 10 to 50 mTorr and the second prescribed pressure of step i) comprises a pressure of approximately $10^{-7}$ Torr;

the transfer pressure of step j) comprises a pressure in the range of 200 to 300 mTorr; and the process pressure of step l) comprises a pressure in the range of 10 to 20 mTorr, and further wherein the GeH$_4$ gas is provided at a partial pressure of approximately 1 to 5 mTorr.

17. A method of constructing a semiconductor device, said method comprising the steps of:
a) providing a substrate;
b) evacuating a reaction chamber and an associated load lock chamber to initial equilibrium pressures of below 10$^{-9}$ Torr;
c) heating the reaction chamber to a prescribed process temperature;
d) precleaning the substrate;
e) placing the substrate into the load lock chamber, whereby the load lock chamber pressure rises to atmospheric pressure, the load lock chamber being isolated from the reaction chamber during the placing of the substrate into the load lock chamber;
f) evacuating the load lock chamber slowly from atmospheric pressure to a first prescribed pressure and then further evacuating the load lock chamber quickly from the first prescribed pressure to a second prescribed pressure;
g) bleeding H$_2$ into the reaction chamber, whereby the reaction chamber pressure rises to a transfer pressure;
h) opening the load lock chamber to the reaction chamber and transferring the substrate from the load lock chamber to the reaction chamber, whereby the bleeding of H$_2$ of the previous step reduces cross contaminating between the load lock chamber and the reaction chamber during the transfer, and wherein the substrate heats up to the prescribed process temperature inside the reaction chamber; and,
i) stopping the bleeding of H$_2$ and providing a mixture of GeH$_4$ and He gas int he reaction chamber to thereby deposit Ge onto the substrate, and wherein the reaction chamber equilibrates to a process pressure.

18. A method of constructing a semiconductor device, according to claim 17, wherein said substrate is comprised of Si.

19. A method of constructing a semiconductor device, according to claim 17, wherein said substrate is comprised of Ge$_x$Si$_{1-x}$.

20. A method of constructing a semiconductor device, according to claim 17, wherein said mixture is on the order of 10% of GeH$_4$ and 90% He.

21. A method of constructing a semiconductor device, according to claim 17, wherein the partial pressure of GeH$_4$ is 1 to 5 mTorr.

22. A method of constructing a semiconductor device, according to claim 17, wherein step d) comprises:
immersing said substrate in a 5:1:1 solution of H$_2$O:H$_2$O$_2$:NH$_4$OH at 65° C. for 1 minute;
rinsing said substrate with deionized H$_2$O;
immersing said substrate in a 5:1:1 solution of H$_2$O:H$_2$O$_2$:HCl at 65° C. for 1 minute; and,
rinsing said substrate with deionized H$_2$O.

23. A method of constructing a semiconductor device, according to claim 17, wherein step d) comprises providing said mixture at a flow rate on the order of 12.5 to 25 sccm.

24. A method of constructing a semiconductor device, according to claim 17, wherein step c) comprises heating to a temperature on the order of 300° to 375° C.

25. A method of constructing a semiconductor device, according to claim 17, wherein step d) comprises immersing said substrate in about a 10:1 solution of H$_2$O:HF at room temperature for about 10 to 15 seconds.

26. A method of constructing a semiconductor device, according to claim 17, further comprising the step of depositing Si onto the Ge after step i).

27. A method constructing a semiconductor device, according to claim 26, further comprising the steps of repeating steps b) through i) after depositing Si.

28. The method of claim 17, wherein:
the prescribed process temperature of step c) comprises a temperature on the order of 300° to 375° C.;
the first prescribed pressure of step f) comprises a pressure of approximately 10 to 50 mTorr and the second prescribed pressure of step f) comprises a pressure of approximately 10$^{-7}$ Torr;
the transfer pressure of step g) comprises a pressure in the range of 200 to 300 mTorr; and
the process pressure of step i) comprises a pressure in the range of 10 to 20 mTorr, and further wherein the GeH$_4$ gas is provided at a partial pressure of approximately 1 to 5 mTorr.

29. A method of constructing a semiconductor device, said method comprising the steps of:
a) providing a substrate;
b) evacuating a reaction chamber and an associated load lock chamber to initial equilibrium pressures of below 10$^{-9}$ torr;
c) heating the reaction chamber to a prescribed process temperature;
d) immersing the substrate in about a 5:1:1 solution of H$_2$O;H$_2$O$_2$:NH$_4$OH at about 65° C. for about 1 minute;
e) rinsing the substrate with deionized H$_2$O;
f) immersing the substrate in about a 5:1:1 solution of H$_2$O;H$_2$O$_2$:HCl at about 65° C. for about 1 minute;
g) rinsing the substrate with dionized H$_2$O;
h) immersing the substrate in about a 10:1 solution of H$_2$O:HF at room temperature for about 10 to 15 seconds;
i) placing the substrate into the load lock chamber, whereby the load lock chamber pressure rises to atmospheric pressure, the load lock chamber being isolated from the reaction chamber during the placing to the substrate into the load lock chamber;
j) evacuating the load lock chamber slowly from atmospheric pressure to a first prescribed pressure and then further evacuating the load lock chamber quickly from the first prescribed pressure to a second prescribed pressure;
k) bleeding H$_2$ into the reaction chamber, whereby the reaction chamber pressure rises to a transfer pressure;
l) opening the load lock chamber to the reaction chamber and transferring the substrate from the load lock chamber to the reaction chamber, whereby the bleeding of H$_2$ of the previous step reduces cross contamination between the load lock chamber and the reaction chamber during the transfer, and wherein the substrate heats up to the prescribed process temperature inside the reaction chamber; and,
m) stopping the bleeding of H$_2$ and providing a mixture of GeH$_4$ and He gas in the reaction chamber to thereby deposit Ge onto the substrate, and wherein the reaction chamber equilibrates to a process pressure.

30. The method of claim 29, wherein:

the prescribed process temperature of step c) comprises a temperature on the order of 300° to 375° C.;

the first prescribed pressure of step j) comprises a pressure of approximately 10 to 50 mTorr and the second prescribed pressure of step j) comprises a pressure of approximately $10^{-7}$ Torr;

the transfer pressure of step k) comprises a pressure in the range of 200 to 300 mTorr; and the process pressure of step m) comprises a pressure in the range of 10 to 20 mTorr, and further wherein the GeH$_4$ gas is provided at a partial pressure of approximately 1 to 5 mTorr.

31. A method of constructing a semiconductor device, according to claim 29, wherein said substrate is comprised of Si.

32. A method of constructing a semiconductor device, according to claim 29, wherein said substrate is comprised of Ge$_x$Si$_{1-x}$.

33. A method of constructing a semiconductor device, according to claim 29, further comprising the step of depositing Si onto the Ge after the last step.

34. The method of claim 1, wherein:

the prescribed process temperature of step b) comprises a temperature on the order of 300° to 375° C.;

the first prescribed pressure of step e) comprises a pressure of approximately 10 to 50 mTorr and the second prescribed pressure of step e) comprises a pressure of approximately b $10^{-7}$ Torr;

the transfer pressure of step f) comprises a pressure in the range of 200 to 300 mTorr; and the process pressure of step h) comprises a pressure in the range of 10 to 20 mTorr, and further wherein the GeH$_4$ gas is provided at a partial pressure of approximately 1 to 5 mTorr.

* * * * *